United States Patent [19]

Lewiner et al.

[11] Patent Number: 4,626,729

[45] Date of Patent: Dec. 2, 1986

[54] ELECTROACOUSTIC PIEZOELECTRIC TRANSDUCERS

[76] Inventors: Jacques Lewiner, 5, rue Bory d'Arnex, 92210 Saint-Cloud; Claude Hennion, 18, rue Flatters, 75005 Paris, both of France

[21] Appl. No.: 728,768

[22] Filed: Apr. 30, 1985

[30] Foreign Application Priority Data

May 4, 1984 [FR] France ............................... 84 06987

[51] Int. Cl.[4] ............................................ H01L 41/08

[52] U.S. Cl. .................................... 310/324; 310/800; 387/174; 387/191

[58] Field of Search ............................... 310/800, 324; 179/110 A

[56] References Cited

U.S. PATENT DOCUMENTS 3,792,204 2/1974 Murayama et al. ............ 310/800 X
4,156,800 5/1979 Sear et al. ........................ 310/800 X
4,401,911 8/1983 Ravinet et al. ...................... 310/800
4,419,599 12/1983 Micheron ........................ 310/800 X
4,440,983 4/1984 Facoetti et al. ................. 310/800 X
4,535,205 8/1985 Ravinet et al. ................. 179/110 A

*Primary Examiner*—Peter S. Wong
*Assistant Examiner*—Emanuel Todd Voeltz
*Attorney, Agent, or Firm*—Larson and Taylor

[57] ABSTRACT

The invention relates to an electroacoustic piezoelectric transducer comprising a mechanically stretched vibrating membrane composed of a polymer sheet (10) jointly interposed between two metallic electrodes (9 and 11), one of them (11) being constituted by metallization of one of the faces of the polymer sheet (10). The other electrode (9) is constituted by an autonomous metallic sheet offering a high resistance to mechanical tension, adhering intimately against the other face of the polymer sheet.

2 Claims, 1 Drawing Figure

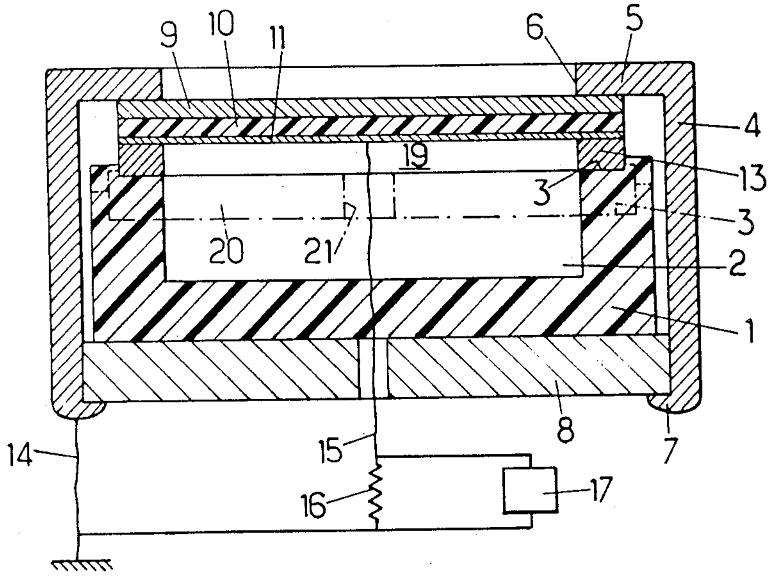
9
10
11
6
5
4
19
13
3
3
20
21
2
1
8
7
14
15
16
17

ELECTROACOUSTIC PIEZOELECTRIC TRANSDUCERS

The invention relates to electroacoustic piezoelectric transducers which include a mechanically stretched vibrating membrane constituted of a thin piezoelectric polymer sheet jointly interposed between two conductive electrodes.

The transducers of the kind in question permit the transformation of acoustic waves into variable electric currents or voltages and vice versa so they are well suited to make microphones and headphones or loudspeakers.

In the case of microphones, the acoustic waves are exploited in such a way that the membrane is vibraitng, which in turns induces at the same frequency a stress on the polymer sheet, and the variable electrical currents or voltages created by these stress variations are collected between the electrodes for further exploitation.

The case is exactly inverse with headphones or loudspeakers.

In these various devices, it is advantageous to have the vibrating membrane both of low mass and high mechanical tension so that its resonance frequency becomes as high as possible and that the bandwidth of the devices becomes as large as possible.

The known embodiments of these devices, for which the electrodes are generally constituted by vacuum deposited metal layers on both sides of the polymer sheet, are not satisfactory in this respect.

Such a realization is indeed favourable as far as the low mass of the membrane is concerned, but it is very unfavourable from the point of view of the mechanical tension, since the very thin metallized layers offer a very weak resistance to such a tension; the same applies to the polymer sheet: consequently only a small mechanical tension can be applied to such a membrane and its resonance frequency is relatively low. Moreover, the mechanical tension of the membrane is very sensitive to temperature variations, and so is the sensitivity and the bandwidth of the corresponding transducers.

It is particular object of the invention to overcome these various drawbacks.

Accordingly, the transducers of the above type still comprise an electrode constituted by metallization of one of the faces of the polymer sheet and they are essentially characterized by the fact that their other electrode is constitued by an autonomous metallic sheet of high resistance to mechanical tension, adhering intimately to the other face of said polymer sheet.

Said intimate adherence can be advantageously obtained by the process involving a double electrical and thermal effect, as is taught in french Pat. No. 84 06801, that is to say by heating the two sheets juxtaposed and electrostatically attracted one against the other one through the presence of an electrical field at the interface of the two sheets.

The invention comprises, apart from these principal arrangements, certain other arrangements which are preferably used at the same time and which will be more explicitly discussed hereafter.

In what follows some preferred embodiments of the invention will be described with reference to the accompanying drawing in a way which is of course in no wise limiting.

The single FIGURE of this drawing shows, in cross section, an electroacoustic piezoelectric transducer according to the invention.

The transducer includes in a already known manner:

- a supporting insulating bowl 1, of which the inside voluem 2, limited on its periphery by an annular edge 3, constitutes an acoustic cavity,
- a surrounding cylindrical metallic case 4 presenting at one of its axial extremities an edge 5 pulled towards the side, said edge defining the circumference of a circular opening 6 for the reception and the emission of sounds, the other axial extremity of this case being crimped in 7 on a metallic closing disk 8 applied against supporting bowl 1,
- interposed and pressed axially between the edges 5 and 3, a stretched electrode 9 forming a vibrating membrane and connected electrically to the edge 5, a piezoelectric polymer sheet 10, a metallic back electrode 11 and a washer 13 used as a spacing member and/or as a supporting member for applying the mechanical tension to the membrane,
- electric conductors 14, 15, the first one for grounding the case and the second for the connection of the back electrode 11 to the electrical exploitation or emitting circuits 16, 17.

The invention relates essentially to the constitution of electrodes 9 and 11, and the polymer sheet 10, and their mutual assembly.

Electrode 9 is here constituted by a metallic sheet presenting a good resistance to mechanical tension and adhered in intimate and tenacious contact against polymer sheet 10.

The mechanical tension applied permanently to the composite membrane including the sheets 9 and 10 is advantageously comprised between 100 and 1000 Nm and practically the metallic sheet 9 withstands alone the resistance to this tension.

This metallic sheet 9 is for instance made of steel, case in which its thickness is comprised between 10 and 100 microns, preferably of the order of 50 microns, or of nickel, case in which its thickness is comprised between 2 and 10 microns preferably of the order of 4 microns.

The polymer sheet 10 presents a thickness comprised between 5 and 50 microns and a high electric resistivity, that is to say more than $10^9$ Ohms-meter, and preferably more than $10^{10}$ Ohms-meters.

It is in general constituted by a fluorinated polymer such as the polyvinylidene fluoride or one of its copolymers.

The adherence between the two sheets 9 and 10 is preferably obtained by the method taught in the french patent No. 84 06801 of the applicants.

According to this method, one juxtaposes first the sheets 9 and 10 one against the other, then one injects electrically charged particules in the polymer sheet 10, which induces image charges of opposite sign in the metallic sheet 9, which is connected to the ground; this produces a tight application of the two sheets 9 and 10 one against the other one by electrostatic effect and the one heats this composite assembly in this condition of mutual "electrostatic bonding" of its components until softening or even melting of polymer sheet 10.

According to one variant, one makes grow progressively the metallic sheet 9, for instance in nickel, on one of the faces of the polymer sheet 10 by an electrolytic deposition made after vacuum or electrochemical deposition of a very thin conducting layer, of a thickness of the order of 1000 Å, on said sheet 10.

The back electrode 11 is constituted by a very thin metallic film whose thickness is generally smaller than one micron, deposited by vaccum evaporation of cathodic sputtering, on the side of the polymer sheet 10 which is the most distant from the metallic sheet 9.

The periphery of the triple layer composite membrane 9, 10 and 11 is pressed here between washer 13 and edge 5.

We have schematized in broken lines on the drawing a stiff partition plate 20 perforated in 21, the circumference of which is pressed between the edge 3 of the insulating bowl 1 and washer 13, partition plate separating the acoustic cavity 2 from the deformable chamber 19 which is directly in contact with the back electrode 11 submitted to the acoustic vibrations. This partition 20 is not indispensable.

The transducer equipped with the composite vibrating membrane 9, 10, 11 hereabove described presents a large number of advantages: particularly, as the metallic sheet 9 offers a good resistance to mechanical tension, one can stretch the membrane up to very high values of mechanical tension by any known means and thus obtain a very high value of the resonance frequency of the membrane and, moreover, said resonance frequency is independant of the temperature.

As is itself evident and as it follows moreover from what has already been described, the invention is in no wise limited to those of its embodiments and modes of application which have been more especially considered; it embraces, on the contrary, all variations thereof, particularly those where:

the face of the metallic sheet 9 the most distant of the polymer sheet 10 would be covered by a dielectric layer in order to protect sheet 9 against oxidation the assembly composed by the polymer sheet 10 and by all the other elements situated on the same side of the metallic sheet 9 as the polymer sheet 10, would symmetrically be doubled with respect to this sheet 9, on the other side of this sheet, holes being then foreseen in the different parts 1 and 8 in order to give way to sounds between the outside of the device and the central vibrating composite membrane which would then be fivefold.

We claim:

1. An electroacoustic piezoelectric transducer including a mechanically stretched vibrating membrane composed of a piezoelectric polymer sheet interposed between two metallic electrodes, one of said electrodes being constituted by metallization of one of the faces of the polymer sheet, and the other said electrode being constituted by an autonomous metallic sheet of high resistance to mechanical tension applied in a direction in or parallel to the plane of the metallic sheet, and in intimate adherence to the other face of said polymer sheet, the mechanical tension applied to the composite membrane being essentially withstood by said autonomous metallic sheet.

2. A transducer as claimed in claim 1 wherein the mechanical tension applied to the composite membrane comprises between 100 and 1,000 Nm.

* * * * *